United States Patent [19]

Mori et al.

[11] Patent Number: 5,715,171

[45] Date of Patent: Feb. 3, 1998

[54] LOGICAL SYNTHESIZING DEVICE, LOGICAL SYNTHESIZING METHOD, AND SEMICONDUCTOR INTEGRATED CIRCUIT

[75] Inventors: Yasufumi Mori; Tatsunori Komoike; Takeshi Hashizume, all of Hyogo, Japan

[73] Assignee: Mitsubishi Denki Kabushiki Kaisha, Tokyo, Japan

[21] Appl. No.: 533,839

[22] Filed: Sep. 26, 1995

[30] Foreign Application Priority Data

May 24, 1995 [JP] Japan .................. 7-125112

[51] Int. Cl.$^6$ .................. G06F 17/50; G01R 31/28
[52] U.S. Cl. .................. 364/490; 371/22.1
[58] Field of Search .................. 364/488, 489, 364/490, 491, 578; 371/22.3, 22.1

[56] References Cited

U.S. PATENT DOCUMENTS

| | | | |
|---|---|---|---|
| 4,831,543 | 5/1989 | Mastellone | 364/489 |
| 5,519,627 | 5/1996 | Mahmood et al. | 364/488 |
| 5,550,839 | 8/1996 | Buch et al. | 371/22.1 |

OTHER PUBLICATIONS

Brglez et al., "Synergy of Synthesis and Test", 1989 IEEE 8th Biennial Univ./Gov't./Industry Symposium, pp. 240–245.

Cheng et al., "A Partial Scan method for Sequential Circuits w/Feedback," IEEE Trans. on Computers, vol. 39, No. 4, Apr. 1990, pp. 544–548.

Courjon, "Scan Design in the Philips ASIC Test Environment," Euro ASIC '90, pp. 370–375.

*Primary Examiner*—Kevin J. Teska
*Assistant Examiner*—Leigh Marie Garbowski
*Attorney, Agent, or Firm*—Oblon, Spivak, McClelland, Maier & Neustadt, P.C.

[57] ABSTRACT

A logical synthesizing device and logical synthesizing method capable of generating a net list from a feedback loop added flip-flop excellent in layout efficiency. In a cell library, cells of feedback loop added flip-flop are newly registered together with existing various cells. The feedback loop portion of this feedback loop added flip-flop is formed in an optimum layout composition in consideration of the setup time and hold time. A logical synthesizing section, using the cells registered in the cell library, generates a net list for realizing a logical function description, and outputs to a test design section At this time, the feedback loop forming portion in the input and output of the flip-flop generates the net list by using the feedback loop added flip-flop.

10 Claims, 11 Drawing Sheets

FIG. 18

LOGICAL SYNTHESIZING DEVICE, LOGICAL SYNTHESIZING METHOD, AND SEMICONDUCTOR INTEGRATED CIRCUIT

BACKGROUND OF THE INVENTION

1. Field of the Invention

The present invention relates to a logical synthesizing device and logical synthesizing method for outputting a net list composed of connection information in consideration of easiness of layout of flip-flop composed of micro cells and provided with a feedback loop, and a semiconductor integrated circuit manufactured by such logical synthesizing method.

2. Description of the Background Art

In a semiconductor integrated circuit manufactured in a semi-custom system represented by gate array or the like for designing the layout by extracting cells from a cell library in which cells of flip-flop circuits and others are registered preliminarily, when designing the circuit by using flip-flop circuits, without using gated clock in which validity and invalidity of clock are controlled by logic gate, it was necessary, for holding the data, to form a feedback loop for inputting the output of the flip-flop circuit into the flip-flop circuit outside the flip-flop circuit. Recently, for the sake of efficiency of design, it is the logical synthesizing device that is widely used in manufacture of integrated circuit device of semi-custom system, in particular.

Figure 15:
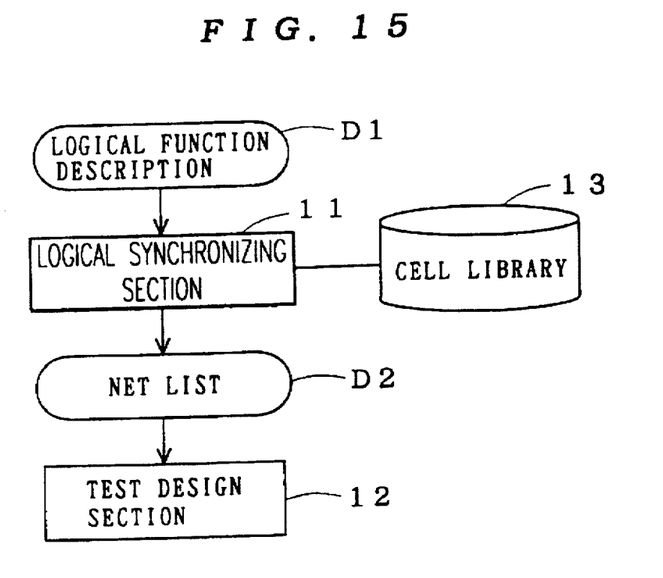
FIG. 15 is a block diagram showing the constitution of a conventional logical synthesizing device.

FIG. 15 is a block diagram showing the constitution of a logical synthesizing device. As shown in the diagram, a logical synthesizing section 11 receives a logical function description D1 in which the logical function desired by the user of the logical synthesizing device is described in a specific logical language, and creates a net list D2 for realizing the logical function description D1 and outputs to a test designing section 12, by using a cell or a micro cell registered in a cell library 13. The test designing section 12 connects scan input and output between cells having scan input and output for executing the scan test on the basis of the net list D2.

Figure 16:
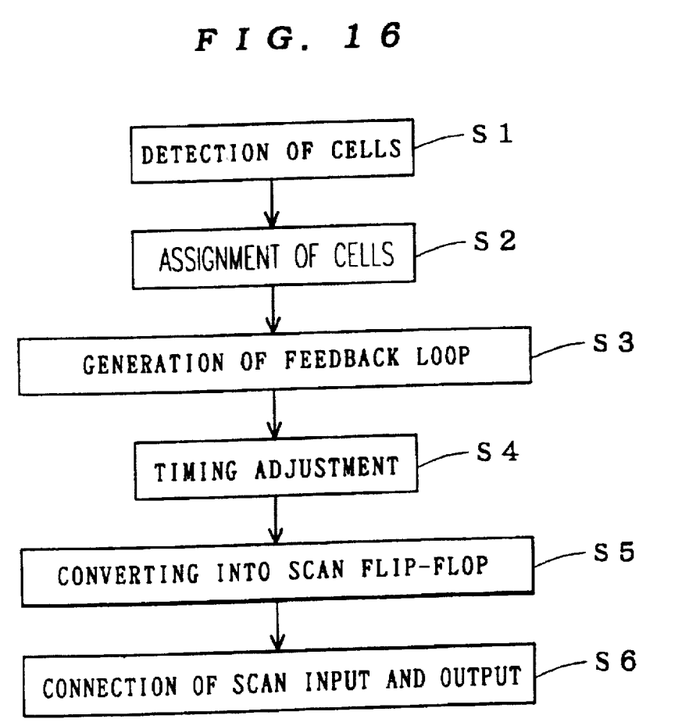
FIG. 16 is a flow chart showing the operation of the conventional logical synthesizing device.

FIG. 16 is a flow chart for showing the operation of the logical synthesizing device. In the diagram, the operation at steps S1 to S4 is effected by the logical synthesizing section 11, while the operation at steps S5 and S6 is effected by the test designing section 12.

Referring to the diagram, at step S1, the logical synthesizing section 11 detects a cell (including a micro cell) satisfying the logical function description D1 from the cell library 13, and assigns the detected cell at step S2.

At step S3, the logical synthesizing section 11 creates a feedback loop on the basis of the connection relation of the circuit defined in the logical function description d1, and adjusts the timing of setup time and hold time about the data from output to input of the flip-flop at step S4, and outputs the net list D2 to the test designing section 12.

Afterwards, the test designing section 12, in order to execute the scan test, converts all flip-flops into scan flip-flops to be applicable to scan test at step S5, and connects scan input and output between scan flip-flops at step S6, thereby setting in the state in which scan test can be executed.

The conventional logical synthesizing device was thus constituted and performed logical synthesizing operation.

However, when creating a feedback loop in the input and output of the flip-flop at step S3 in FIG. 16, in order to realize the flip-flop circuit with feedback loop by synthesizing plural cells such as flip-flop circuit cells and selector circuit cells, at step S4, an inverter chain was inserted by force into the feedback loop for hold timing adjustment of the flip-flop, which caused deterioration of circuit performance due to increase of scale, etc.

To improve deterioration of circuit performance, in succession to step S4, it is necessary to add an extra step of deleting the inverter chain inserted by logical combination and adjusting delay by metal wiring, but when such extra step is added, the design efficiency is also lowered.

Figure 17:
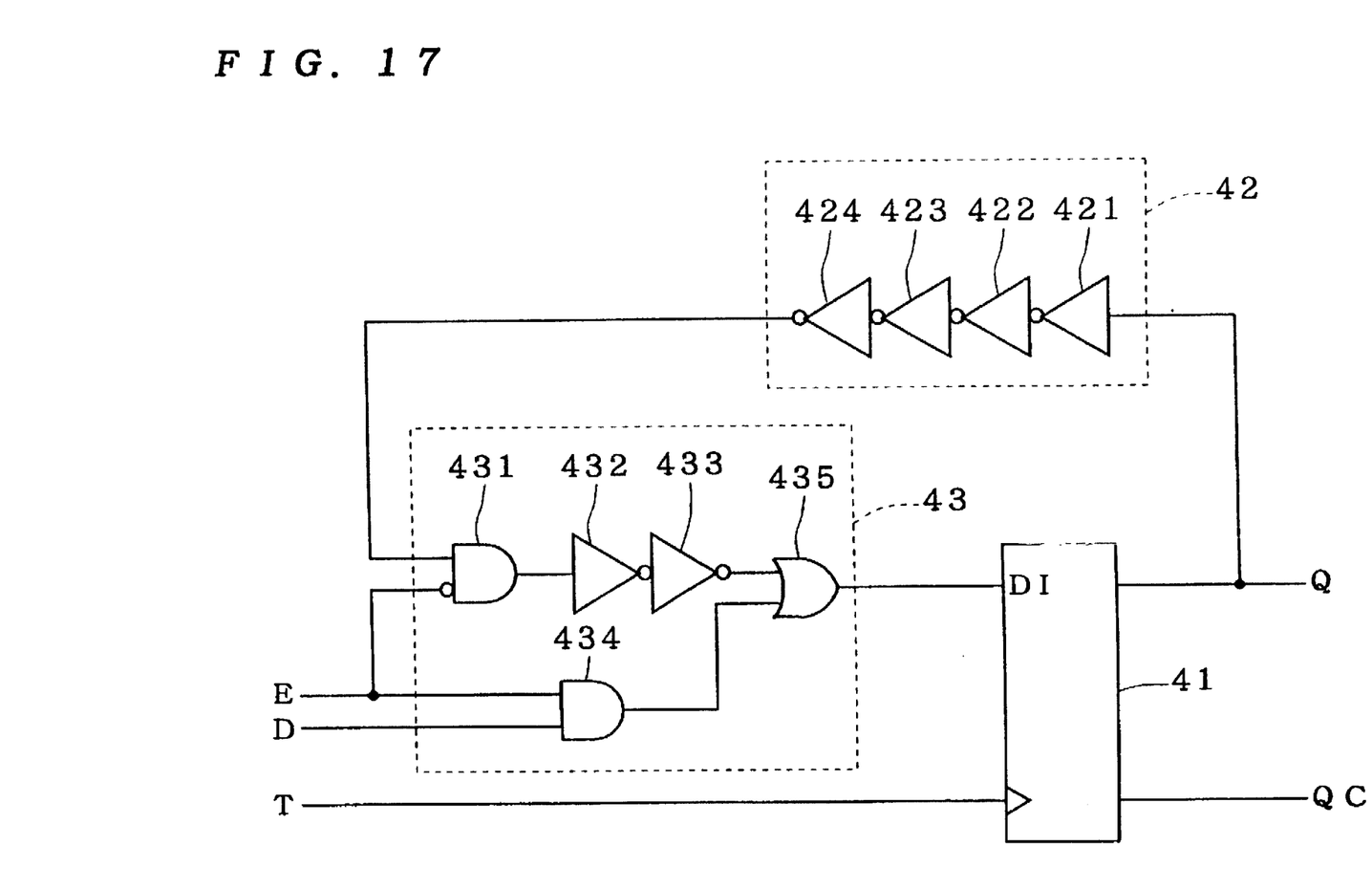
FIG. 17 is a circuit diagram showing an example of feedback loop added flip-flop generated by logical combination.

FIG. 17 is a circuit diagram showing a conventional feedback loop added flip-flop. As shown in the diagram, a selection signal E and a data input signal D are inputted into a selection circuit 43, a clock input T and an output of the selection circuit 43 are added to a flip-flop 41, an output Q and an inverted output QC are outputted from the flip-flop 41, and the output Q is fed back to the selection circuit 43 through a delay circuit 42.

In this way, the delay circuit 42 by inverter chain composed of inverters 421 to 424 is inserted in the feedback loop section of the flip-flop 41, and the inverter chain composed of inverters 432 and 433 is inserted in the selection circuit 43, and thus unnecessary cells are increasing the scale. Reference numerals 431, 434 are AND gates, and 435 is an OR gate.

At the time of logical combination, for timing adjustment between flip-flop circuits, the timing of the feedback loop section must be also adjusted, and the execution time for logical combination is increased.

Figure 18:
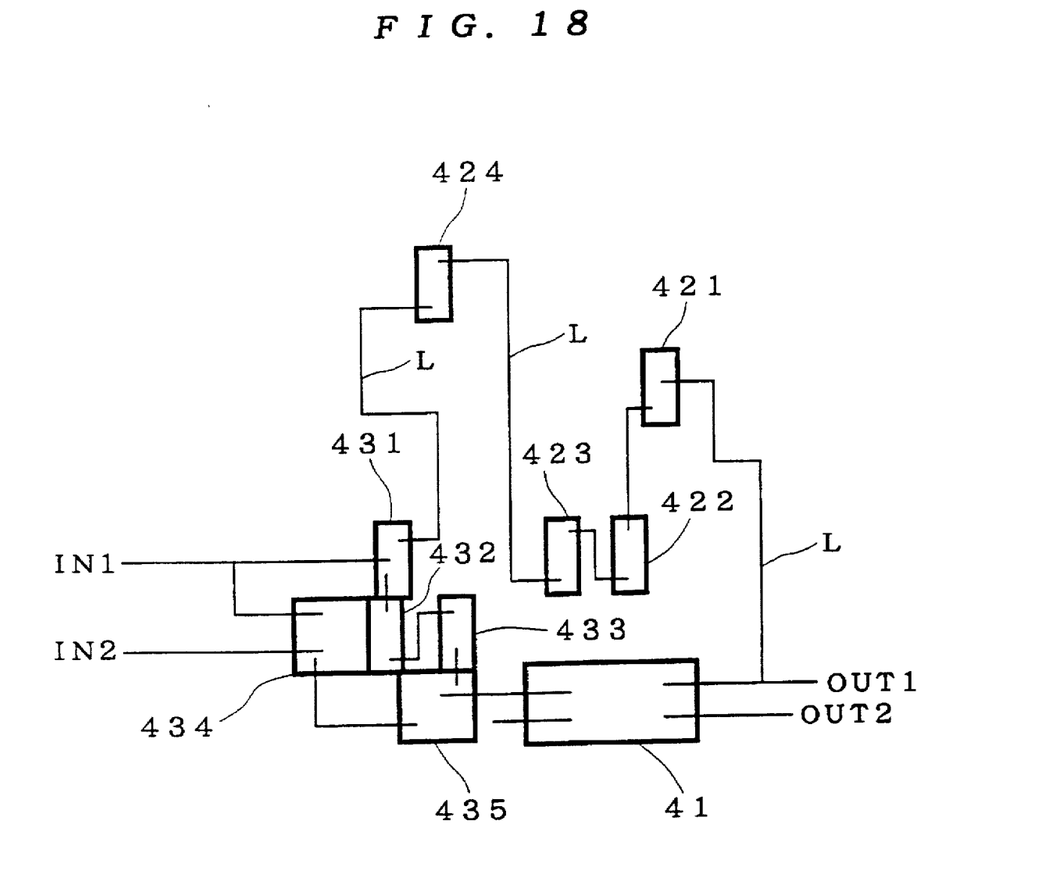
FIG. 18 is a plan view showing a layout structural example of a feedback loop added flip-flop generated by logical combination.

In actual layout of the feedback loop added flip-flop as shown in FIG. 17, since the feedback loop section passes through many cells (421 to 424, 431 to 433, and 435) as shown in FIG. 18, the wiring length and number of wiring of the metal wiring L in the feedback loop section are increased. In addition, as shown in FIG. 18, since these related cells are not always disposed in the adjacent places, both circuit performance and layout efficiency are lowered.

Moreover, concerning the feedback loop, in the design state of logical description, it is necessary to describe with consciousness (so that the feedback loop may be created), and it took time and description amount in the logical description design stage.

SUMMARY OF THE INVENTION

A first aspect of the invention relates to a logical synthesizing device comprising logical function description providing means for providing logical function description for defining the logical connection relation, a library for registering at least a cell of feedback loop added flip-flop having a feedback loop between an input and output thereof with a favorable layout adaptability in consideration of setup time and hold time thereof, and net list generating means for receiving the logical function description, and generating a net list defining element information of logical elements and their connection information, by using the cells registered in the library, on the basis of the logical function description, wherein the net list generating means assigns, with respect to a flip-flop having a feedback loop between an input and output thereof, the cell of the feedback loop added flip-flop to the flip-flop and its feedback loop portion.

A second aspect of the invention relates to a logical synthesizing device, wherein the library further is a cell library further registering various cells other than the cell of the feedback loop added flip-flop.

A third aspect of the invention relates to a logical synthesizing device, wherein the library is a flip-flop library for registering only the cell of the feedback loop added flip-flop, the logical synthesizing device further comprising a cell library for registering various cells other than the cell of the feedback loop added flip-flop, and wherein the net list generating means includes logical synthesizing means for receiving the logical function description, and generating an original net list defining element information of logical elements and their connection information, by using cells registered in the cell library, on the basis of the logical function description, and flip-flop converting means for receiving the original net list to convert, with respect to a flip-flop having a feedback loop between an input and output thereof, the flip-flop and its feedback loop into the feedback loop added flip-flop registered in the flip-flop library, on the basis of the original net list, thereby generating the net list.

A fourth aspect of the invention relates to a logical synthesizing device, wherein the feedback loop added flip-flop contains a feedback loop added scan flip-flop having scan input and output capable of performing scan test at its input and output.

A fifth aspect of the invention relates to a logical synthesizing method, using a cell library registering various cells including a cell of feedback loop added flip-flop having a feedback loop between an input and output thereof with favorable layout adaptability in consideration of setup time and hold time thereof, comprising the steps of (a) detecting a feedback loop provided between input and output of flip-flop on the basis of the logical function description defining the logical connection relation, (b) assigning a cell of the feedback loop added flip-flop from the cell library, to the feedback loop detected at step (a) and the corresponding flip-flop portion, and (c) generating a net list by assigning other cells than the cell of the feedback loop added flip-flop from the cell library, on the basis of the logical function description.

A sixth aspect of the invention relates to a logical synthesizing method, using a flip-flop library registering a cell of feedback loop added flip-flop having a feedback loop between an input and output thereof with favorable layout adaptability in consideration of setup time and hold time thereof, and a cell library registering various cells, comprising the steps of (a) generating an original net list by assigning the cells registered in the cell library, on the basis of a logical function description for defining the logical connection relation, and (b) converting, with respect to a flip-flop having a feedback loop between an input and output thereof, the flip-flop and its feedback loop into the cell of the feedback loop added flip-flop registered in the flip-flop library, on the basis of the original net list, thereby generating a net list.

A seventh aspect of the invention relates to a logical synthesizing method, wherein the feedback loop added flip-flop may include a feedback loop added scan flip-flop having scan input and output capable of performing scan test at its input and output.

An eighth aspect of the invention relates to a semiconductor integrated circuit manufactured according to the net list generated by a logical synthesizing method of the fifth aspect.

According to the first aspect of the invention, the net list generating means of the logical synthesizing device assigns, with respect to a flip-flop having a feedback loop between an input and output thereof, the cell of the feedback loop added flip-flop having a feedback loop between an input and output thereof with favorable layout adaptability in consideration of the setup time and hold time thereof preliminarily registered in the library, to the flip-flop and its feedback loop portion, on the basis of the logical function description, and therefore it is not necessary to consider the setup time and hold time of the feedback loop of the flip-flop when generating the net list.

As a result, efficient logical synthesizing process is realized, and unnecessary cell is not inserted in the feedback loop providing part when adjusting the timing of setup time and hold time in the net list generating stage, so that the net list can be generated at high layout efficiency.

According to the second aspect, the library of the logical synthesizing device is a cell library further registering various cells other than the cell of the feedback loop added flip-flop, and therefore the feedback loop added flip-flop can be simultaneously assigned when assigning cells from the cell library on the basis of the logical function description.

In the logical synthesizing device, according to the third aspect, the library is a flip-flop library for registering only the cell of the feedback loop added flip-flop, and it further comprises a cell library for registering various cells other than the cell of feedback loop added flip-flop, and the net list generating means includes logical synthesizing means for receiving the logical function description, and generating an original net list defining element information of logical elements and their connection information, by using cells registered in the cell library, on the basis of the logical function description, and flip-flop converting means for receiving the original net list to convert, with respect to a flip-flop having a feedback loop between an input and output thereof, the flip-flop and its feedback loop into the feedback loop added flip-flop registered in the flip-flop library, on the basis of the original net list, thereby generating the net list.

Therefore, by using the existing logical synthesizing means and cell library, and newly adding a flip-flop library and flip-flop converting means, the logical synthesizing device of the third aspect is constituted.

As a result, while making the best of the constituent components of the existing logical synthesizing device, it is effective to generate a net list of high layout efficiency.

In the logical synthesizing device, according to the fourth aspect, since the feedback loop added flip-flop includes a feedback loop added scan flip-flop having scan input and output capable of performing scan test at its input and output, it is not necessary to replace the feedback loop added flip-flop with the feedback loop added scan flip-flop when designing the scan test.

As a result, it is effective to generate a net list capable of executing scan test without converting process into the scan flip-flop.

According to the fifth aspect of the invention, in step (b) of the logical synthesizing method, cells of the feedback loop added flip-flop are assigned from the cell library to the feedback loop detected at step (a) and the corresponding flip-flop portion.

It is therefore not necessary to consider the setup time and hold time of the feedback loop of the flip-flop when generating the net list.

As a result, efficient logical synthesizing process is realized, and unnecessary cell is not inserted in the feedback loop providing part when adjusting the timing of setup time and hold time in the net list generating stage, so that the net list can be generated at high layout efficiency.

According to the sixth aspect of the invention, in the logical synthesizing method of the sixth aspect of the invention, since step (b) is for converting, with respect to a flip-flop having the feedback loop between an input and output thereof, the flip-flop and its feedback loop into the cell of the feedback loop added flip-flop registered in the flip-flop library, on the basis of the original net list, thereby generating a net list, the generating process of the original net list at step (a) can be executed in the existing method using the existing cell library.

As a result, by newly adding the step (b) which is the process after generation of original net list, it is effective to generate the net list of high layout efficiency, while making the best of the existing logical synthesizing method.

According to the seventh aspect of the invention, in the logical synthesizing method of the seventh aspect of the invention, since the feedback loop added flip-flop contains a feedback loop added scan flip-flop having scan input and output capable of executing scan test at its input and output, it is not necessary to replace the feedback loop added flip-flop with the feedback loop added scan flip-flop when designing the scan test.

As a result, without converting process to the scan flip-flop, it is effective to generate a net list capable of easily executing scan test.

The semiconductor integrated circuit of the eighth aspect of the invention may be manufactured according to the net list generated by the logical synthesizing method of the fifth aspect.

Therefore, when the logical function description defining the semiconductor integrated circuit requests feedback loop provided between an input and output of flip-flop, the semiconductor integrated circuit is composed by using the feedback loop added flip-flop having a feedback loop favorable in layout adaptability in consideration of the setup time and hold time.

As a result, a semiconductor integrated circuit of high performance and superior layout efficiency can be obtained.

The semiconductor integrated circuit of the eighth aspect of the invention may be also manufactured according to the net list generated by the logical synthesizing method of the sixth aspect.

Therefore, when the original net list defining the semiconductor integrated circuit requests feedback loop provided between an input and output of flip-flop, the semiconductor integrated circuit is composed by using the feedback loop added flip-flop having the feedback loop favorable in layout adaptability in consideration of the setup time and hold time.

As a result, a semiconductor integrated circuit of high performance and superior layout efficiency can be obtained.

The semiconductor integrated circuit of the eighth aspect of the invention may be also manufactured according to the net list generated by the logical synthesizing method of the seventh aspect.

Therefore, when the logical function description defining the semiconductor integrated circuit requests feedback loop provided between an input and output of flip-flop, the semiconductor integrated circuit is composed by using the feedback loop added scan flip-flop having a feedback loop and scan input and output favorable in layout adaptability in consideration of the setup time and hold time.

As a result, a semiconductor integrated circuit of high performance, superior layout efficiency, and capable of executing scan test easily can be obtained.

It is therefore an object of the present invention to provide a logical synthesizing device and logical synthesizing method capable of creating a net list composed of feedback loop added flip-flop excellent in layout efficiency, in order to solve the problems of the prior art.

These and other objects, features, aspects and advantages of the present invention will become more apparent from the following description of the present invention when taken in conjunction with the accompanying drawings.

DESCRIPTION OF THE PREFERRED EMBODIMENTS

<First Preferred Embodiment>

Figure 1:
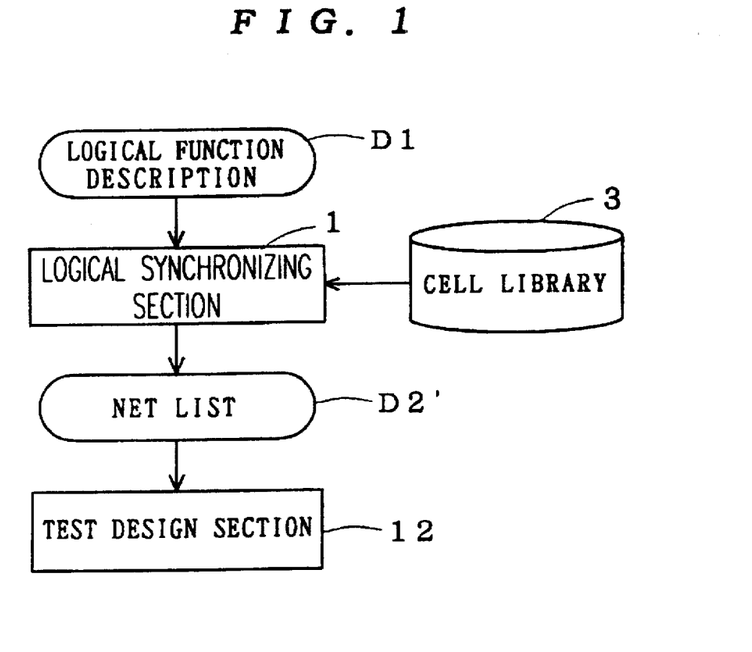
FIG. 1 is a block diagram showing the constitution of a logical synthesizing device in a first preferred embodiment of the invention.

FIG. 1 is a block diagram showing the constitution of a logical synthesizing device in a first preferred embodiment of the invention. As shown in the diagram, a logical synthesizing section 1 which is net list generating means receives a logical function description D1 specifying the logical connection relation, describing the circuit function desired by the user of the logical synthesizing device in a specific logical language, and can access to a cell library 3 in which various cells (including micro cells) are registered. Together with various existing cells, a cell of the feedback loop added flip-flop are newly registered in the cell library 3.

Figure 2:
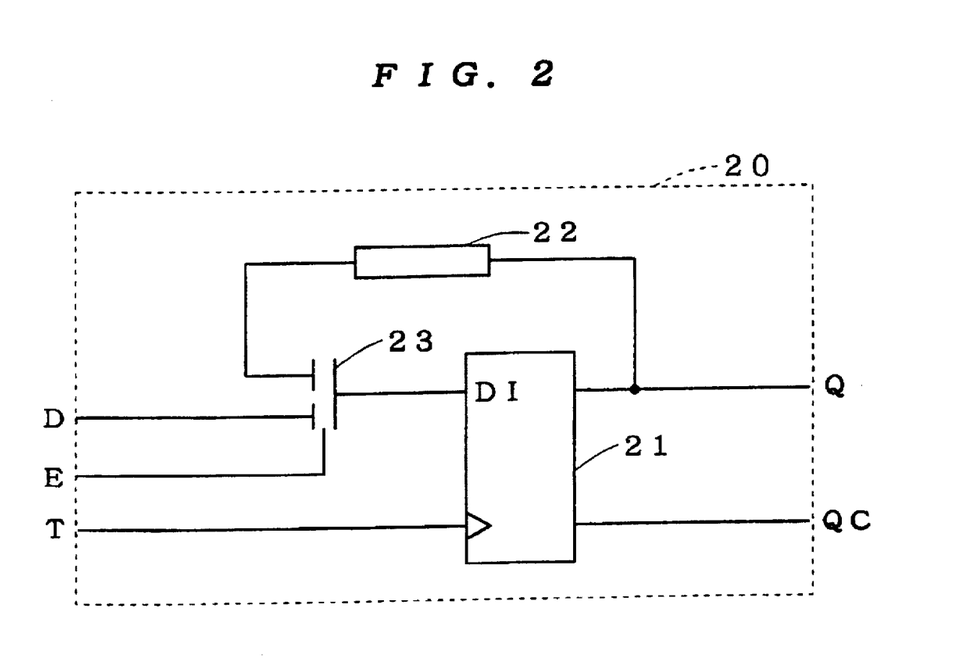
FIG. 2 is a descriptive diagram showing an internal structure of a feedback loop added flip-flop.

This feedback loop added flip-flop is registered as reusable design data for CAD in the library as layout, logical combination model (defining the number of required transistors, logical operation execution time, etc.), and simulation model (defining the actual logical operation, etc.). FIG. 2 is an explanatory diagram showing an example of feedback loop added flip-flop. As shown in the diagram, a feedback loop added flip-flop 20 is composed of a flip-flop 21, a delay circuit 22, and a selection circuit 23. The flip-flop 21 externally outputs the output Q and inverted output QC. The delay circuit 23 receives a data input signal D in a second input and a selection signal E in a control input. The selection circuit 23 applies one of the data input signal D and output Q to the input unit of the flip-flop 21 according to the selection signal E. A clock input T is applied to a clock input of the flip-flop 21.

Figure 3:
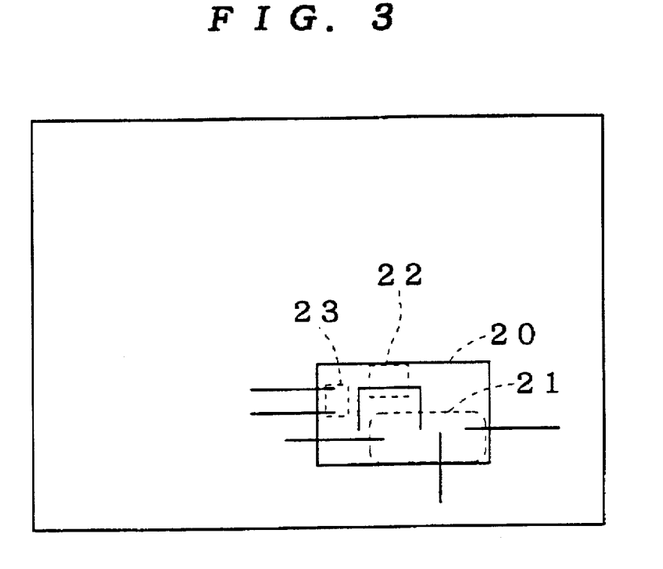
FIG. 3 is a plan view showing the layout structure of a feedback loop added flip-flop.

The delay circuit 22 and selection circuit 23 are adjusted in timing so as to satisfy the setup time and hold time of the flip-flop 21, and are composed of an optimum layout structure. Therefore, as shown in FIG. 3, the flip-flop 21, delay circuit 22, and selection circuit 23 can be composed in the cell of the feedback loop added flip-flop 20 at high layout efficiency, and the feedback loop added flip-flop 20 can be composed in the circuit scale of a minimum required limit.

Figure 4:
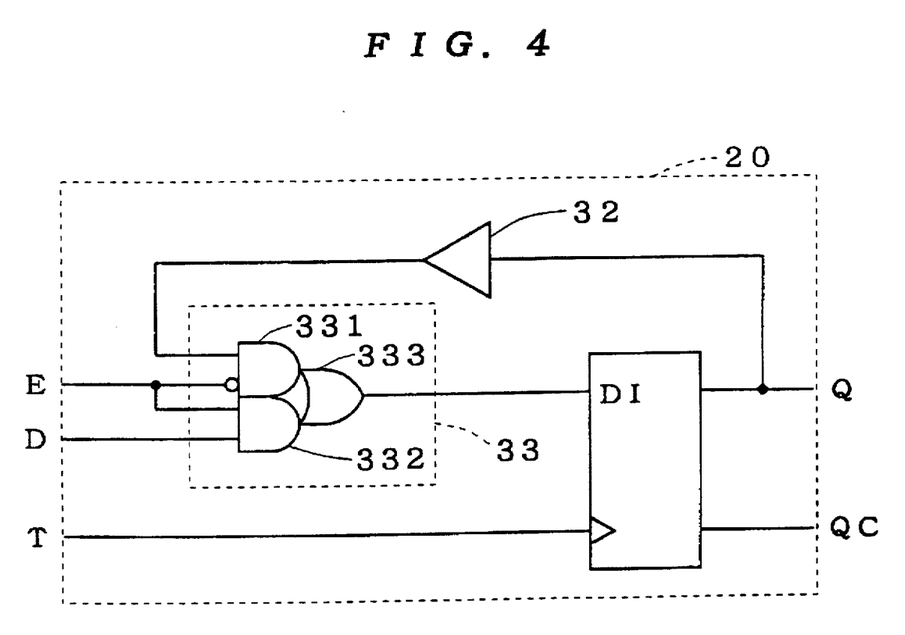
FIG. 4 is a circuit diagram showing a first example of internal structure of a feedback loop added flip-flop.

FIG. 4 is a circuit diagram showing a first example of an actual circuit composition in the feedback loop added flip-flop 20. As shown in the diagram, the feedback loop added flip-flop 20 is composed of the flip-flop 21, a buffer 32, and a synthesized logical circuit 33. The buffer 32 corresponds to the delay circuit 22 in FIG. 2, and the synthesized logical circuit 33 to the selection circuit 23.

As shown in the diagram, the flip-flop 21 externally outputs the output Q and inverted output QC, and also outputs the output Q to the synthesized logical circuit 33 through the buffer 32. The synthesized logical circuit 33 is composed of AND gates 331, 332, and OR gate 333, and the AND gate 331 receives inverted signals of output (output Q) of the buffer 32 and selection signal E, and the AND gate 332 receives the selection signal E and data input signal D. The OR gate 333 receives the outputs of the AND gates 331 and 332, and gives its output to a data input DI of the flip-flop 21.

Therefore, the synthesized logical circuit 33 gives the data input signal D to the data input DI of the flip-flop 21 when the selection signal E is "H", and feeds back the output Q when the selection signal E is "L" to the data input DI of the flip-flop 21. Besides, the clock input T is given to the clock input of the flip-flop 21.

Figure 5:
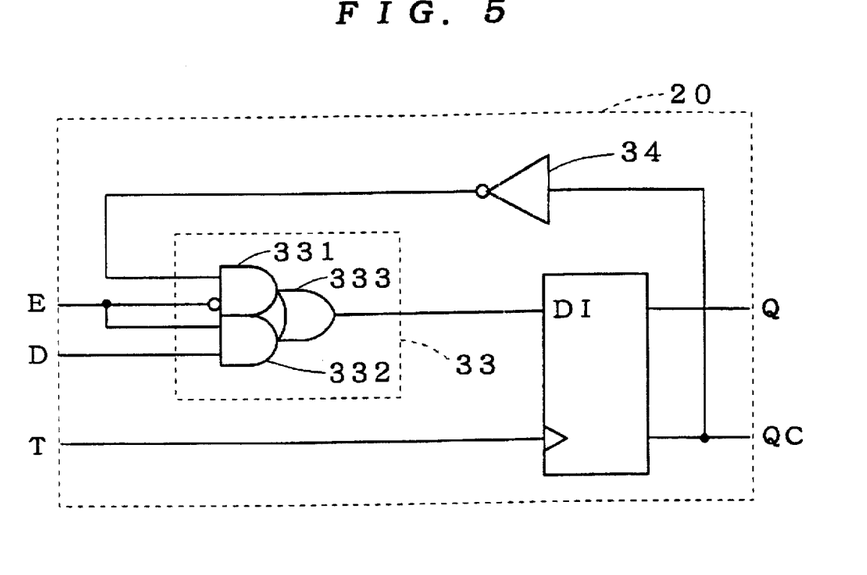
FIG. 5 is a circuit diagram showing a second example of internal structure of a feedback loop added flip-flop.

FIG. 5 is a circuit diagram showing a second example of an actual circuit composition in the feedback loop added flip-flop 20. As shown in the diagram, the feedback loop added flip-flop 20 is composed of the flip-flop 21, an inverter, 34, and the synthesized logical circuit 33. The inverter 34 corresponds to the delay circuit 22 in FIG. 2.

As shown in the diagram, the flip-flop 21 externally outputs the output Q and inverted output QC, and also outputs the inverted output QC to one input of the AND gate 331 of the synthesized logical circuit 33 as output Q through the inverter 34.

Therefore, the synthesized logical circuit 33 gives the data input signal D to the data input DI of the flip-flop 21 when the selection signal E is "H", and feeds back the output Q when the selection signal E is "L" to the data input DI of the flip-flop 21. The clock input T is given to the clock input of the flip-flop 21.

Back to FIG. 1, the logical synthesizing section 1 generates a net list D2' for realizing the logical function description D1 by using the cell registered in the cell library 3, and outputs to a test design section 12. At this time, if necessary, the net list D2' is generated by using the cell of feedback loop added flip-flop shown in FIG. 2 to FIG. 5. That is, with respect to a flip-flop providing a feedback loop between an input and output thereof, the cell of the feedback loop added flip-flop are assigned to the flip-flop and its feedback loop portion.

The test design section 12, on the basis of the net list D2', generates a net list connecting scan input and output between cells having scan input and output so as to execute the scan test.

Figure 6:
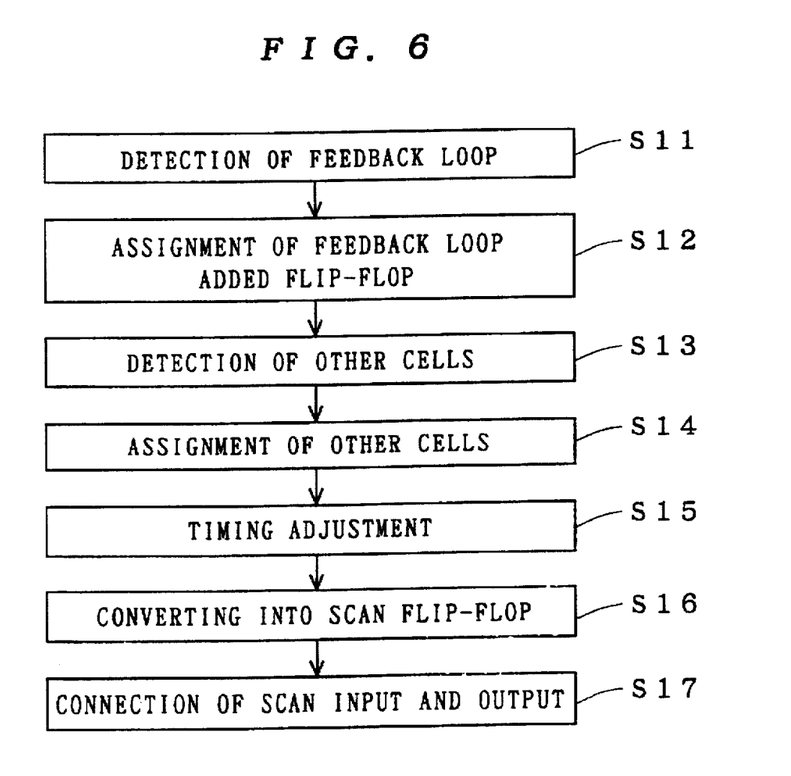
FIG. 6 is a flow chart showing the operation of the logical synthesizing device in the first preferred embodiment of the invention.

FIG. 6 is a flow chart showing a logical synthesizing method using the logical synthesizing device in the first preferred embodiment. In the diagram, the operation at steps S11 to S15 is effected by the logical synthesizing section 1, and the operation at steps S16 and S17 is effected by the test design section 12.

Referring to the diagram, at step S11, the logical synthesizing section 1 detects by priority the feedback loop of the flip-flop formed in the circuit defined by the logical function description D1, and assigns the cell of the feedback loop added flip-flop having the feedback loop portion of the flip-flop detected at step S12 registered in the cell library 3.

At step S13, the logical synthesizing section 1 detects the cell that satisfies the logical function description D1 from the cell library 3, in the position than the feedback loop of the flip-flop of the circuit defined by the logical function description D1, and, at step S14, assigns the cell detected at step S13.

At step S15, after adjusting the timing other than the setup time and hold time of the feedback loop added flip-flop, the logical synthesizing section 1 outputs the net list d2' to the test design section 12.

Afterwards, the test design section 12, at step S16, converts all flip-flops into scan flip-flops capable executing test scan, in order to execute test scan, and, at step S17, connects the scan input and output between scan flip-flops, and generates a net list capable of executing scan test.

Thus, in the logical synthesizing device of the first preferred embodiment, by preliminarily registering the cell of the feedback loop with flip-flop considering the setup time and hold time, it is not necessary to consider the setup time and hold time of the feedback loop, and hence, unlike the prior art shown in FIG. 17, unnecessary cells (inverters 422, 423, 432, 433) are not inserted into the feedback loop portion or selection circuit portion when adjusting the timing, thereby generating a net list of better layout efficiency. Besides, when synthesizing the logic of the logical synthesizing section 1, timing adjustment of the feedback loop portion is not necessary, so that efficient logical synthesizing process can be executed.

In addition, in the logical synthesizing device of the first preferred embodiment, unlike the prior art shown in FIG. 18, cells are not dispersed and arranged for forming the feedback loop or the wiring L of the feedback loop is not extended, so that a net list of high performance can be generated.

As a result, using the logical synthesizing device in the first preferred embodiment, the semiconductor device manufactured according to the net list generated in the logical synthesizing method shown in FIG. 6 is high in performance and excellent in layout efficiency.

Moreover, since the cells of the feedback loop added flip-flop and various cells are registered in the cell library 3, when assigning the cells from the cell library 3 on the basis of the logical function description D1, the feedback loop added flip-flop can be assigned at the same time.

<Second Preferred Embodiment>

Figure 7:
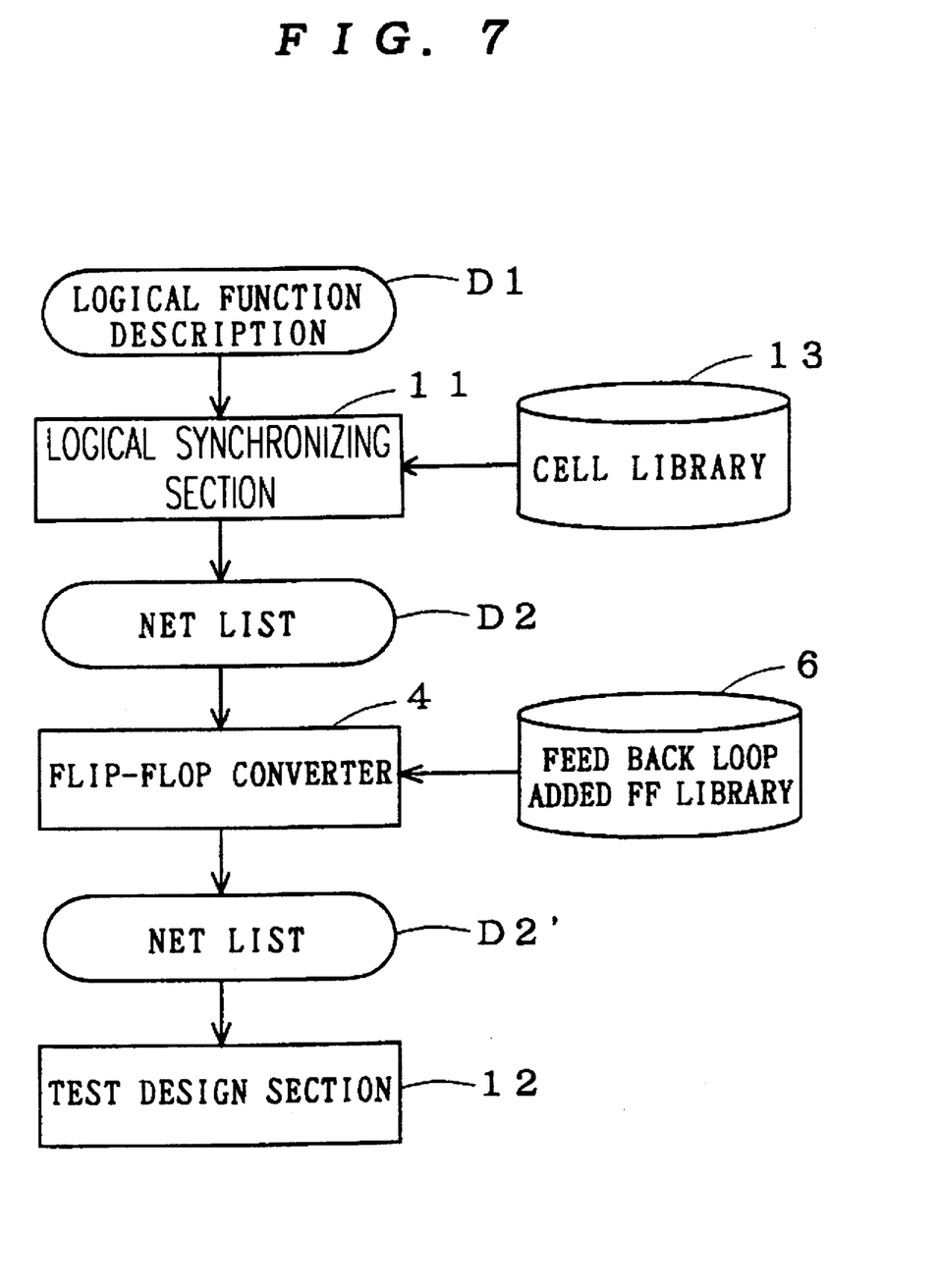
FIG. 7 is a block diagram showing the constitution of a logical synthesizing device in a second preferred embodiment of the invention.

FIG. 7 is a block diagram showing a constitution of a logical synthesizing device in a second preferred embodiment of the invention. As shown in the diagram, a logical synthesizing section 11 receives a logical function description D1 specifying the logical connection relation, describing the circuit function desired by the user of the logical synthesizing device in a specific logical language, and can access to a cell library 13 in which various cells (including micro cells) are registered.

The local synthesizing section 11 generates a net list D2 (original net list) for realizing the logical function description D1, by using the cells registered in the cell library 13, and outputs to a flip-flop converter 4.

The flip-flop converter 4 receives the net list D2, and can access an FF library with feedback loop 6 in which a cell of feedback loop added flip-flop are registered. The feature of the feedback loop added flip-flop and its internal structure are same as those of the feedback loop added flip-flop in the first preferred embodiment.

When the flip-flop converter 4 detects the flip-flop forming a feedback loop at its input and output in the circuit defined by the net list D2, it converts its flip-flop and its feedback loop portion into the flip-flop with feedback obtained from the FF library with feedback loop 6, and outputs the net list D2' composed of feedback loop added flip-flop to the test design section 12. In this way, the net list generating means is composed of the logical synthesizing section 11 and flip-flop converter 4.

The test design section 12 generates a net list connecting scan input and output between cells having scan input and output so as to execute scan test, on the basis of the net list D2'.

Figure 8:
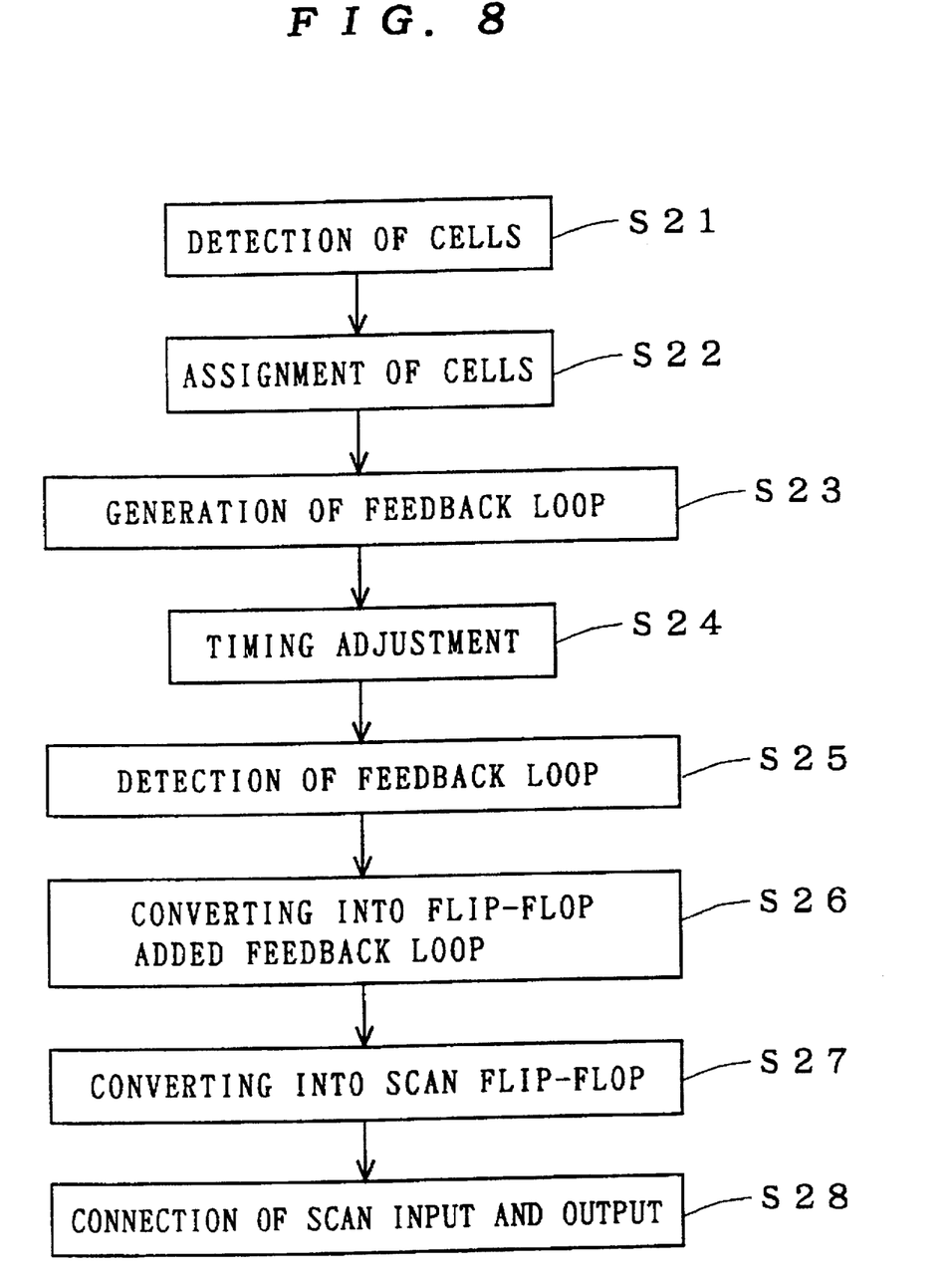
FIG. 8 is a flow chart showing the operation of the logical synthesizing device in the second preferred embodiment of the invention.

FIG. 8 is a flow chart showing a logical synthesizing method using the logical synthesizing device in the second preferred embodiment. In the diagram, g the operation at steps S21 to S25 is effected by the logical synthesizing section 11, the operation at steps S25 and S26 is effected by the flip-flop converter 4, and the operation at steps S27 and S28 is executed by the test design section 12.

Referring to the diagram, at step S21, the logical synthesizing section 11 detects the cell satisfying the logical function description D1 from the cell library 3, in the circuit defined by the logical function description D1, and, at step S22, assigns the cell detected at step S21.

At step S23, the logical synthesizing section 11 generates a feedback loop according to the connection relation of the circuit defined by the local function description D1, and, at step S24, the logical synthesizing section 11 adjusts the timing of setup time and hold time of the feedback loop added flip-flop, and outputs the net list D2 to the flip-flop converter 4.

At step S25, the flip-flop converter 4 detects the flip-flop forming a feedback loop at its input and output, in the circuit defined by the net list D2, and, at step S26, outputs the net list D2' obtained by converting the flip-flop detected at step S25 and its feedback loop into the feedback loop added flip-flop obtained from the FF library with feedback loop 6, to the test design section 12.

Afterwards, at step S27, the test design section 12, in order to execute scan test, converts all flip-flops into scan flip-flops capable of executing scan test, and, at step S28, generates a net list connecting the scan input and output between the scan flip-flops.

Thus, in the logical synthesizing device of the second preferred embodiment, by preliminarily registering cells of feedback loop added flip-flop considering the setup time and hold time in the FF library with feedback loop 6, a net list with excellent layout efficiency can be generated when converting the feedback loop added flip-flop.

In the logical synthesizing device of the second preferred embodiment, same as in the first preferred embodiment, since cells are not dispersed and arranged for forming the feedback loop or the wiring of the feedback loop is not extended, a high performance net list can be generated.

As a result, the semiconductor integrated circuit manufactured according to the net list generated in the logical synthesizing method shown in FIG. 8 by using the logical synthesizing device in the second preferred embodiment is high in performance and excellent in layout efficiency.

In addition, the logical synthesizing device in the second preferred embodiment can be realized in a constitution of installing the flip-flop converter 4 between the existing logical synthesizing section 11 and test design section 12, so that the constituent parts of the existing logical synthesizing device and logical synthesizing process (processing at steps S21 to S24 in FIG. 8) can be utilized to the maximum extent.

<Third Preferred Embodiment>

Figure 9:
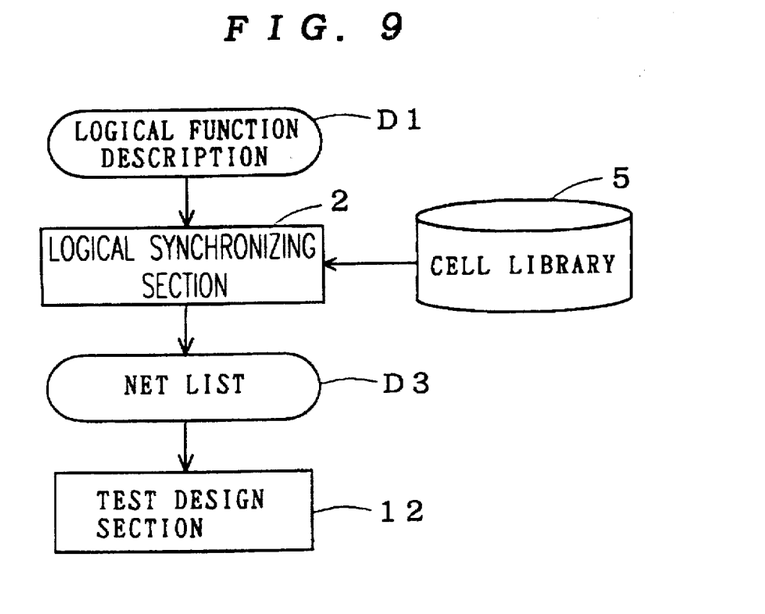
FIG. 9 is a block diagram showing the constitution of a logical synthesizing device in a third preferred embodiment of the invention.

FIG. 9 is a block diagram showing the constitution of a logical synthesizing device in a third preferred embodiment of the invention. As shown in the diagram, the logical synthesizing section 2 which is the net list generating means receives a logical function description D1 specifying the logical connection relation, describing the circuit function desired by the user of the logical synthesizing device in a specific logical language, and can access to a cell library 5 in which various cells are registered. In the cell library 5, together with existing various cells, a cell of feedback loop added scan flip-flop are newly registered.

Figure 10:
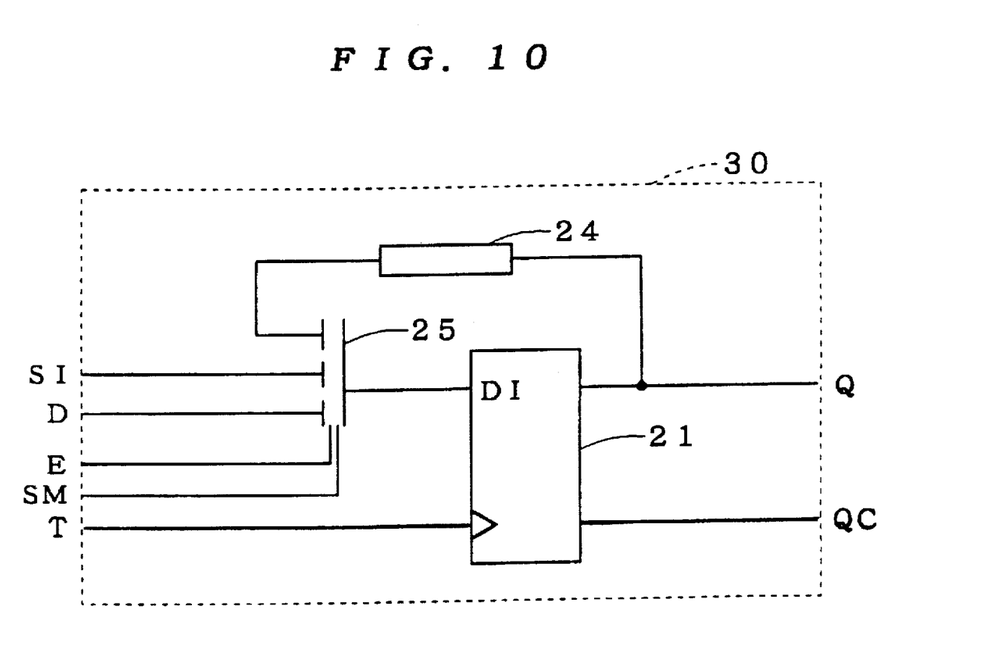
FIG. 10 is an explanatory diagram showing the internal structure of a feedback loop added scan flip-flop.

This feedback loop added scan flip-flop is registered as reusable design data for CAD in the library, as layout and logical synthesizing model and simulation model. FIG. 10 is an explanatory diagram showing an example of feedback loop added scan flip-flop. As shown in the diagram, a feedback loop added scan flip-flop 30 is composed of flip-flop 21, delay circuit 24, and selection circuit 25. The flip-flop 21 externally outputs the output Q and inverted output QC, and also gives the output Q to a first input of the selection circuit 25 through the delay circuit 24. The selection circuit 25 receives a test data input signal SI in a second input, a data input signal D in a third input, and a test mode changeover signal SM and a selection signal E in a control input. Then, according to the test mode changeover signal SM and selection signal E, the selection circuit 25 gives one signal out of the data input signal D, test data input signal St and output Q to the input unit of the flip-flop 21. The clock input T is given to a clock input of the flip-flop 21.

The delay circuit 24 and selection circuit 25 are adjusted in the timing to satisfy the setup time and hold time of the flip-flop 21, and are composed in an optimum layout structure. Therefore, the feedback loop added scan flip-flop 30 can be composed in the circuit scale of a minimum required limit.

Figure 11:
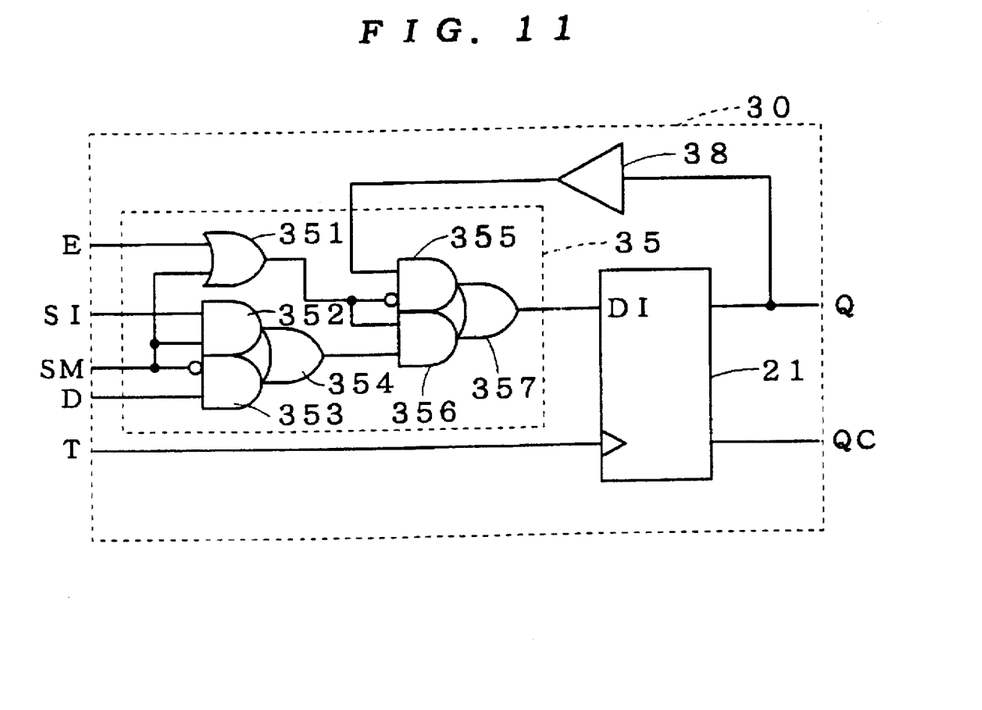
FIG. 11 is a circuit diagram showing a first example of internal structure of a feedback loop added scan flip-flop.

FIG. 11 is a circuit diagram showing a first example of an actual circuit structure in the feedback loop added scan flip-flop 30. As shown in the diagram, the feedback loop added scan flip-flop 30 is composed of flip-flop 21, a buffer 38, and a synthesized logical circuit 35. The buffer 38 corresponds to the delay circuit 24 in FIG. 10, and the synthesized logical circuit 35 to the selection circuit 25.

As shown in the diagram, the flip-flop 21 externally outputs the output Q and inverted output QC, and also outputs the output Q to the synthesized logical circuit 35 through the buffer 38. The synthesized logical circuit 35 is composed of OR gates 351, 354, 357, and AND gates 352, 353, 355, and 356, the OR gate 351 receives the selection signal E and test mode changeover signal SM, the AND gate 352 receives the test data input signal SI and test mode changeover signal SM, the AND gate 353 receives an inverted signal of the test mode changeover signal SM and data input signal D, the OR gate 354 receives the outputs of the AND gates 352 and 353, the AND gate 355 receives the output (output Q) of the buffer 38 and an inverted output of the OR gate 351, the AND gate 356 receives the output of the OR gate 351 and the output of the OR gate 354, and the OR gate 357 receives the outputs of the AND gates 355 and 356, and gives its output to the data input DI of the flip-flop 21.

Therefore, the synthesized logical circuit 35 gives the test data input signal SI to the data input DI of the flip-flop 21 when the test mode changeover signal SM is "H" regardless of "H" or "L" of the selection signal E, and gives the data input signal D to the data input DI of the flip-flop 21 when the test mode changeover signal SM is "L" and the selection signal E is "H", and feeds back the output Q to the data input DI of the flip-flop 21 when both test mode changeover signal SM and selection signal E are "L". The clock input T is given to the clock input of the flip-flop 21.

Figure 12:
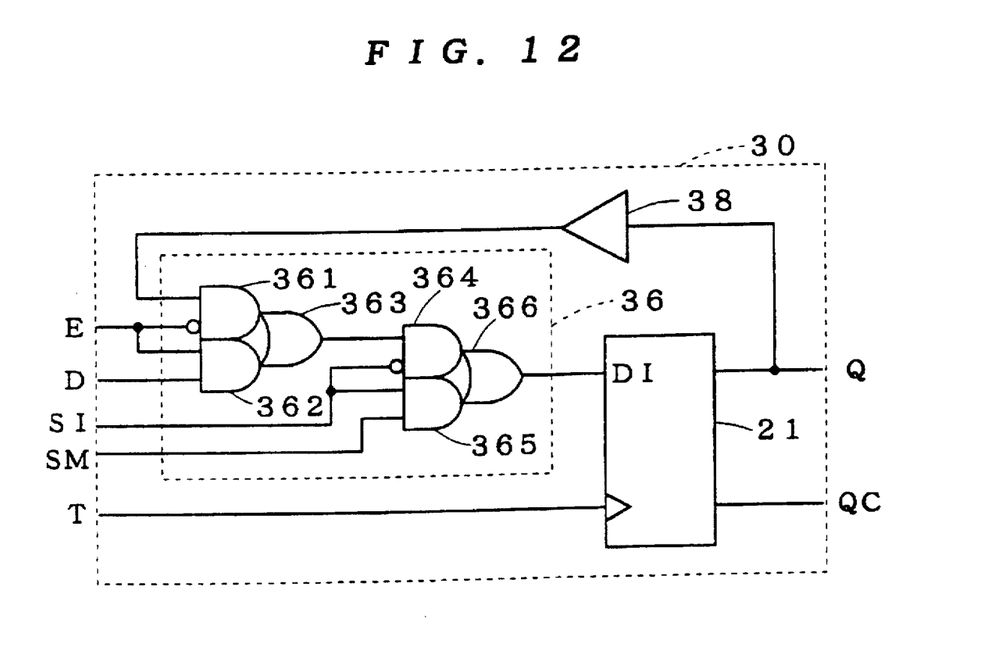
FIG. 12 is a circuit diagram showing a second example of internal structure of a feedback loop added scan flip-flop.

FIG. 12 is a circuit diagram showing a second example of an actual circuit structure in the feedback loop added scan flip-flop 30. As shown in the diagram, the feedback loop added scan flip-flop 30 is composed of flip-flop, buffer 38 and synthesized logical circuit 36. The synthesized logical circuit 36 corresponds to the selection circuit 25 in FIG. 10.

As shown in the diagram, the flip-flop 21 externally outputs the output Q and inverted output QC, and also outputs the output Q to the synthesized logical circuit 36 through the buffer 38.

The synthesized logical circuit 36 is composed of AND gates 361, 362, 364, and OR gates 363 and 366, and the AND gate 361 receives the inverted signals of output Q and selection signal E, the AND gate 362 receives selection signal E and data input signal d, the OR gate 363 receives the outputs of the AND gates 361 and 362, the AND gate 364 receives the output of the OR gate 363 and inverted signal of test mode changeover signal SM, the AND gate 365 receives the test mode changeover signal SM and test data input signal SI, and the OR gate 366 receives the outputs of the AND gates 364 and 365, and gives its output to the data input DI of the flip-flop 21.

Therefore, the synthesized logical circuit 36, same as in the first example in FIG. 11, gives the test data input signal SI to the data input DI of the flip-flop 21 when the test mode changeover signal SM is "H" regardless of "H" or "L" of the selection signal E, and gives the data input signal D to the data input DI of the flip-flop 21 when the test mode changeover signal SM is "L" and the selection signal E is "H", and feeds back the output Q to the data input DI of the flip-flop 21 when both test mode changeover signal SM and selection signal E are "L". The clock input T is given to the clock input of the flip-flop 21.

Figure 13:
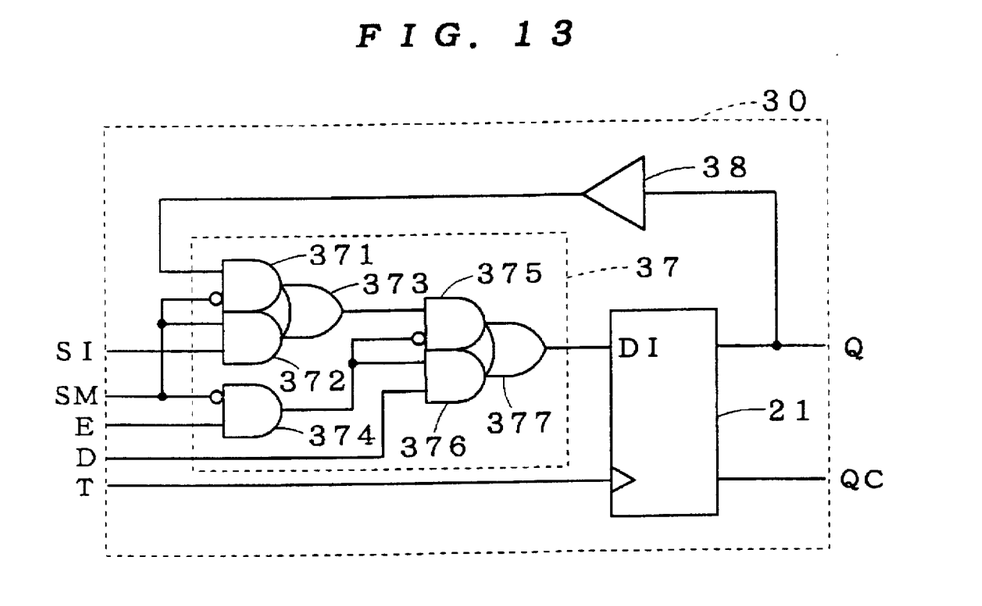
FIG. 13 is a circuit diagram showing a third example of internal structure of a feedback loop added scan flip-flop.

FIG. 13 is a circuit diagram showing a third example of an actual circuit structure in the feedback loop added scan flip-flop 30. As shown in the diagram, the feedback loop added scan flip-flop 30 is composed of flip-flop, buffer 38 and synthesized logical circuit 37. The synthesized logical circuit 37 corresponds to the selection circuit 25 in FIG. 10.

As shown in the diagram, the flip-flop 21 externally outputs the output Q and inverted output QC, and also outputs the output Q to the synthesized logical circuit 37 through the buffer 38.

The synthesized logical circuit 37 is composed of AND gates 371, 372, 374, 375 and 376 and OR gates 373 and 377, and the AND gate 371 receives the inverted signals of output Q and mode changeover signal SM, the AND gate 372 receives test mode changeover signal SM and test data input signal SI, the OR gate 373 receives the outputs of the AND gates 371 and 372, the AND gate 374 receives the inverted signal of test mode changeover signal SM and selection signal E, the AND gate 375 receives the output of the OR gate 373 and inverted signal of output of the AND gate 374, the AND gate 376 receives the output of the AND gate 373 and data input signal D, and the OR gate 377 receives the outputs of the AND gates 375 and 376, and gives its output to the data input D1 of the flip-flop 21.

Therefore, the synthesized logical circuit 36, same as in the first and second examples in FIG. 11 and FIG. 12, gives the test data input signal S1 to the data input DI of the flip-flop 21 when the test mode changeover signal SM is "H" regardless of "H" or "L" of the selection signal E, and gives the data input signal D to the data input DI of the flip-flop 21 when the test mode changeover signal SM is "L" and the selection signal E is "H", and feeds back the output Q to the data input DI of the flip-flop 21 when both test mode changeover signal SM and selection signal E are "L". The clock input T is given to the clock input of the flip-flop 21.

Comparing the first to third examples, the second example is one OR cell less than in the first example and the circuit scale can be reduced. In the third example, as compared with the first and second example, the number of logical gate stages of signal route from the data input signal D to the data input DI of flip-flop 21 is reduced from four to two, and the data input signal D reaches the data input DI of the flip-flop 21 in a shorter time, so that the feedback loop added scan flip-flop of high performance can be realized.

Back to FIG. 9, the logical synthesizing section 2, using the cells registered in the cell library 5, generates the net list D3 for realizing the logical function description D1, and outputs to the test design section 12. At this time, if necessary, a net list DI is created by using the feedback loop added scan flip-flop shown in FIG. 10 to FIG. 13. That is, relating to the flip-flop forming a feedback loop at its input and output, the cell of the feedback loop added scan flip-flop are assigned in its flip-flop and its feedback loop portion.

The test design section 12 generates a net list connecting the scan input and output between cells having scan input and output so as to execute the scan test, according to the net list D3.

Figure 14:
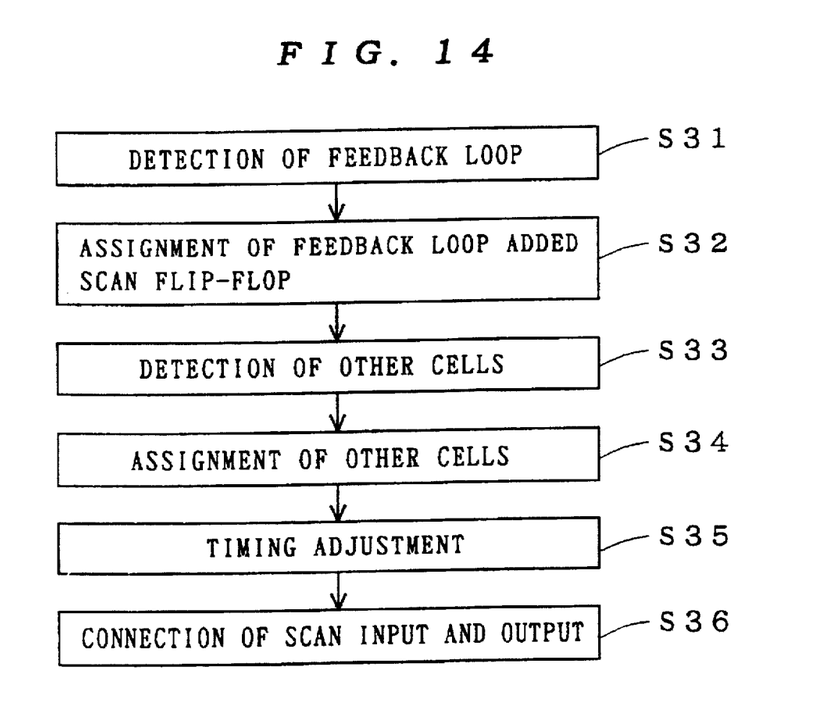
FIG. 14 is a flow chart showing the operation of the logical synthesizing device in the third preferred embodiment of the invention.

FIG. 14 is a flow chart showing the logical synthesizing method using the logical synthesizing device in the third preferred embodiment. In the diagram, the operation at steps S31 to S35 is effected by the logical synthesizing section 2 and the operation at step S36 is effected by the test design section 12.

Referring to the diagram, at step S31, the logical synthesizing section 2 detects by priority the feedback loop of the flip-flop formed in the circuit defined in the logical function description D1, and concerning the detected feedback loop, at step S32, the cell of the feedback loop added scan flip-flop registered in the cell library 5 are assigned in its feedback loop and its flip-flop portion.

At step S33, the logical synthesizing section 2 detects the cell satisfying the logical function description D1 from the cell library 5, in other places than the feedback loop position in the circuit defined by the logical function description D1, and assigns, at step S34, the cell detected as step S33.

At step S35, the logical synthesizing section 2 adjusts the easy timing other than setup time and hold time of the feedback loop added scan flip-flop, and outputs the net list D3 to the test design unit 12.

Afterwards, at step S36, the test design section 12 connects the scan input and output between feedback loop added scan flip-flops, and generates a net list capable of executing scan test.

In this way, in the logical synthesizing device of the third preferred embodiment, by preliminarily registering the cell of the feedback loop added scan flip-flop considering the setup time and hold time in the cell library 5, it is not necessary to consider the setup time and hold time of the feedback loop, and therefore, same as in the first and second preferred embodiments, unnecessary cells are not inserted in the feedback loop portion or selection circuit when adjusting the timing, and a net list of excellent layout efficiency is generated. Besides, at the time of logical combination of the logical synthesizing section 1, timing adjustment of feedback loop portion is not needed, and hence efficient logical synthesizing process can be executed.

In the logical synthesizing device of the third preferred embodiment, same as in the first and second preferred embodiments, cells are not dispersed and arranged for forming the feedback loop or the wiring of the feedback loop is not long, so that a net list of high performance can be generated.

As a result, using the logical synthesizing device in the third preferred embodiment, the semiconductor integrated circuit manufactured according to the net list generated in the logical synthesizing method shown in FIG. 16 is high in performance and excellent in layout efficiency.

In addition, in the logical synthesizing device of the third preferred embodiment, using the feedback loop added scan flip-flop capable of executing scan test as the feedback loop added flip-flop, a net list capable of executing scan test easily can be generated without converting process to the scan flip-flop.

As a result, the semiconductor integrated circuit manufactured according to the net list generated in the logical synthesizing method shown in FIG. 16, using the logical synthesizing device in the third preferred embodiment, is high in performance, excellent in layout efficiency, and easy to execute scan test.

In the cell library 5, moreover, both the cell of the feedback loop added scan flip-flop and various cells are registered, and therefore when assigning the cells from the cell library 3 according to the logical function description D1, the feedback loop added scan flip-flop can be assigned at the same time.

<Others>

By registering the cells of the feedback loop added scan flip-flop shown in the third preferred embodiment in the FF library with feedback loop 6 in the second preferred embodiment, it is also effective to generate a net list capable of executing scan test easily without converting process into scan flip-flop. In this case, being converted into the feedback loop added scan flip-flop at step S26, the processing of step S27 can be skipped.

While the invention has been shown and described in detail, the foregoing description is in all aspects illustrative and not restrictive. It is therefore understood that numerous modifications and variations can be devised without departing from the scope of the invention.

We claim:

1. A logical synthesizing device comprising:
    logical function description providing means for providing logical function description for defining the logical connection relation,
    a library for registering at least a cell of feedback loop added flip-flop having a feedback loop between an input and output thereof with a favorable layout adaptability in consideration of setup time and hold time thereof, and
    net list generating means for receiving said logical function description, and generating a net list defining element information of logical elements and their connection information, by using the cell registered in said library, on the basis of said logical function description,
    wherein said net list generating means assigns, with respect to a flip-flop having a feedback loop between an input and output thereof, said cell of said feedback loop added flip-flop to the flip-flop and its feedback loop portion.

2. A logical synthesizing device of claim 1,
    wherein said library is a cell library further registering various cells other than said cell of said feedback loop added flip-flop.

3. A logical synthesizing device of claim 2, further comprising:
    test setting means for receiving said net list, converting said feedback loop added flip-flop into a scan flip-flop having scan input and output on the basis of said net list, and connecting the scan input and output of said scan flip-flop, thereby generating a net list capable of executing a scan test.

4. A logical synthesizing device of claim 1,
    wherein said library is a flip-flop library for registering only said cell of said feedback loop added flip-flop,
    said logical synthesizing device further comprising a cell library for registering various cells other than said cell of feedback loop added flip-flop, and
    wherein said net list generating means includes:
        logical synthesizing means for receiving said logical function description, and generating an original net list defining element information of logical elements and their connection information, by using cells registered in said cell library, on the basis of said logical function description, and
        flip-flop converting means for receiving said original net list to convert, with respect to a flip-flop having a feedback loop between an input and output thereof, the flip-flop and its feedback loop into said feedback loop added flip-flop registered in said flip-flop library, on the basis of said original net list, thereby generating said net list.

5. A logical synthesizing device of claim 4, further comprising:
    test setting means for receiving said net list, converting said feedback loop added flip-flop into a scan flip-flop having scan input and output on the basis of said net list, and connecting the scan input and output of said scan flip-flop, thereby generating a net list capable of executing a scan test.

6. A logical synthesizing device of claim 4, wherein said feedback loop added flip-flop contains a feedback loop added scan flip-flop having scan input and output capable of performing scan test at its input and output, said logical synthesizing device further comprising:

test setting means for receiving said net list, and connecting scan input and output of said feedback loop added scan flip-flop, thereby generating a net list capable of executing a scan test.

7. A logical synthesizing method, using a cell library registering various cells including a cell of feedback loop added flip-flop having a feedback loop between an input and output thereof with favorable layout adaptability in consideration of setup time and hold time thereof, comprising the steps of:

(a) detecting a feedback loop provided between input and output of flip-flop on the basis of the logical function description defining the logical connection relation, (b) assigning a cell of said feedback loop added flip-flop from said cell library, to the feedback loop detected at step (a) and the corresponding flip-flop portion, and (c) generating a net list by assigning other cells than said cell of the feedback loop added flip-flop from said cell library, on the basis of said logical function description.

8. A logical synthesizing method, using a flip-flop library registering a cell of feedback loop added flip-flop having a feedback loop between an input and output thereof with favorable layout adaptability in consideration of setup time and hold time thereof, and a cell library registering various cells, comprising the steps of:

(a) generating an original net list by assigning said cells registered in said cell library, on the basis of a logical function description for defining the logical connection relation, and (b) converting, with respect to a flip-flop having a feedback loop between an input and output thereof, the flip-flop and its feedback loop into said cell of said feedback loop added flip-flop registered in said flip-flop library, on the basis of said original net list, thereby generating a net list.

9. A logical synthesizing method of claim 7, wherein said feedback loop added flip-flop includes a feedback loop added scan flip-flop having scan input and output capable of performing scan test at its input and output.

10. A semiconductor integrated circuit manufactured according to the net list generated by a logical synthesizing method of claim 7.

* * * * *